United States Patent
Hedrick et al.

(10) Patent No.: US 6,323,436 B1
(45) Date of Patent: *Nov. 27, 2001

(54) HIGH DENSITY PRINTED WIRING BOARD POSSESSING CONTROLLED COEFFICIENT OF THERMAL EXPANSION WITH THIN FILM REDISTRIBUTION LAYER

(75) Inventors: Jeffrey Curtis Hedrick, Park Ridge, NJ (US); Kostas Papathomas, Endicott, NY (US); Amarjit Singh Rai, Vestal, NY (US); Stephen Leo Tisdale, Endwell, NY (US); Alfred Viehbeck, Fishkill, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/833,614

(22) Filed: Apr. 8, 1997

(51) Int. Cl.$^7$ ............................................. H05K 1/04
(52) U.S. Cl. ................................. 174/256; 174/255
(58) Field of Search .................................. 174/250, 255, 174/256, 257, 258, 259, 262, 263; 361/746, 750, 743

(56) References Cited

U.S. PATENT DOCUMENTS

| 3,936,414 | * | 2/1976 | Wright et al. ..................... 523/517 |
| 5,314,742 | * | 5/1994 | Kirayoglu et al. ............... 361/750 X |
| 5,487,218 | * | 1/1996 | Bhatt et al. ...................... 174/262 X |
| 5,571,608 | * | 11/1996 | Swamy .............................. 174/255 X |
| 5,615,477 | * | 4/1997 | Sweitzer ........................... 361/743 X |

FOREIGN PATENT DOCUMENTS 8-316598  *  11/1996  (JP) .

* cited by examiner

Primary Examiner—Jeffrey Gaffin
Assistant Examiner—Jeremy Norris
(74) Attorney, Agent, or Firm—Thomas A. Beck; Daniel Morris

(57) ABSTRACT

Disclosed is a printed circuit board, and a method of preparing a printed circuit board, which possesses a coefficient of thermal expansion substantially similar to that of silicon for use in direct semiconductor chip attach structures and similar solder mounted devices. The printed circuit board is fabricated from prepreg having a thermosetting resin and a reinforcement layer consisting of non-woven aramid mat or a liquid crystalline polymer paper. The composite dielectric layer optionally includes plated through holes which are either filled or non-filled, and one or more thin film redistribution layers to provide high density electronic packages. The design places the solder pads at the PTHs where needed. The redistribution layer can be formed using photoimagable dielectrics or laminated controlled-CTE composites and laser via imaging.

12 Claims, 2 Drawing Sheets

HIGH DENSITY PRINTED WIRING BOARD POSSESSING CONTROLLED COEFFICIENT OF THERMAL EXPANSION WITH THIN FILM REDISTRIBUTION LAYER

BACKGROUND OF THE INVENTION

1. Field of the Invention

This invention relates to high density printed wiring boards (PWBs).

In particular, this invention relates to multilayer high density PWBs having plated through holes (PTHs) and/or vias and surface mounted devices (SMDs).

More particularly, the PWBs of the present invention include novel structure and materials yielding marked improvements in electrical and mechanical properties as well as efficiency in use of component surface area. The fabrication process is surprisingly simpler than might be expected of a highly dense PWB structure and involves the use of conventional fabrication techniques and equipment.

2. Background and Art

The integrated circuit and printed circuit board industries are in need of low cost highly reliable interconnect schemes that support the rapidly increasing input/output (I/O) count in ASICs and microprocessors. There is a growing interest in alternatives to the standard ceramic chip carriers with more conventional printed circuit boards for single and multichip carrier applications. However, for solder surface mount applications, the coefficient of thermal expansion (CTE) mismatch between the packaged chips and the PWB substrate poses reliability problems due to the potential of solder joint cracking during thermal cycling. One means of addressing this issue has been the use of an encapsulant, such as an underchip encapsulant, to reinforce the solder connection joints. But unless the encapsulant is reworkable, there is risk of losing the entire assembly if one or more chips are defective. It would therefore be advantageous to have a printed circuit board that has an overall CTE of about 10 ppm/° C., and a lower weight and lower dielectric constant than that of glass reinforced laminates for the purpose of direct chip attach. If the overall CTE were reduced sufficiently, the need for encapsulant would be obviated.

High performance printed circuit boards require high circuit, component, and interconnection density, including either or both solder surface mount components or additional circuitry layers aligned directly atop plated through holes and/or blind vias. The latter case provides additional wiring density since the redistribution layer is not restricted by the through hole pattern in the circuit board. The printed circuit boards of the present invention are especially useful where the density of plated through holes required to service the I/Os of the surface mount devices is such that there would otherwise be insufficient surface area available for placing pads for solder surface mount attachments interstitial to the plated through hole grid. In addition to scarcity of component surface area, soldering SMCs to the surface pads (lands) of unfilled PTHs is difficult because the solder used for assembly tends to wick down into the holes, resulting in low volume, unreliable solder joints.

The drive for increased circuit and component density in PWBs and in assemblies using them makes it highly desirable to be able to solder surface mount components (SMCs) or to place additional circuitry layers directly over the top of PTHs. This is especially the case when the density of the PTHs required to service the I/Os of the SMCs is such that there is no surface area available for attachment pads interstitial to the PTH grid. Such a condition exists with fine pitch Ball Grid Array (BGA) components and Flip Chip Attach (FCA) integrated circuits (IC).

The following references are useful in presenting background information on some approaches to dealing with high density requirements.

On pages 50–54 of the May, 1996 issue of Electronic Packaging and Production, Howard Green and Michael P. Skinner cite the Micromodule Systems (MMS) approach to cost reduction by reducing the number of steps in making a multichip module. The MMS approach involves merging the power plane with the two signal planes and replacing the copper ground plane with an aluminum backplate/heat dissipator.

MMS has not approached the problem which has been addressed by the inventors herein, which is to minimize stresses caused by differences in CTEs within the structure. In fact, the described MMS approach still includes the steps of providing both a gel encapsulant and a cover to defend against the effects of such stresses. MMS's approach is to reduce the dielectric constant by employing a benzocyclobutene (BCB) photosensitive insulator. Because the BCB is not hydrophillic, the moisture removal steps that the use of polyimide required are eliminated. The inventors herein have used a photoactive thin film redistribution layer (TFRL) dielectric, which has a lower dielectric constant and greater moisture resistance than polyimide.

On pages 45–48 of the May, 1996 issue of Electronic Packaging and Production, Brian J. McDermott has contributed "Photodefined Vias Enable High Density Designs", in which he states that mechanical drilling of vias that are smaller in diameter than 10 mils is cost prohibitive and requires pads which consume too much real estate for high density PWBs. As a solution to that problem, he proposes using an epoxy-based photoimageable dielectric to define the vias, and states that the approach of using photoimageable dielectric wherein blind vias drop directly from pads, as compared to conventional mechanical drilling and sequential lamination, reduces the number of major process steps from 33 to 17 while doubling the wiring density.

The present invention maintains vacuum lamination and drilling of the dielectric but provides pad-in-via and/or pad-in-PTH geography. Conductive vias having high aspect ratio are selectively filled, for example with a metal-filled, partially cured resin material which flows into the holes under laminating conditions. Vacuum lamination serves also to remove any gases that might be present in the vias. The ends of the filled vias, along with the rest of the smoothed panel surface, are then plated and circuitized. Wiring density is further enhanced when an additional layer of vias is created in a thin film redistribution layer (TFRL). A TRFL surface facing away from the filled vias, having been plated and circuitized, is laminated, its unplated surface facing onto the circuitized plane at which the filled vias surface.

On pages 68–76 of the May, 1966 issue of Electronic Packaging and Production, Roland Heitmann has contributed an article titled "The Ultimate Connections: BGA and Flip Chip Attachments". The article is useful for its overview of various types of electronic packaging schemes either available commercially or in development, the advantages in choosing one over another for a particular device, and the tradeoffs and problems typical of each.

On pages 177–187 of the Proceedings of the 7th International SAMPE Electronics Conference, held Jun. 20–23, 1994, Gregory E. Homan and David J. Powell of DuPont Company contributed "Fabricating PWBs and MCM-Ls with a New Nonwoven Aramid Reinforcement". The authors describe a nonwoven aramid reinforcement material for PWBs and laminate-based multichip modules (MCM-Ls) that is commercially available under the I.E. DuPont de Nemours registered trademark THERMOUNT. The authors maintain that the nonwoven aramid material is suitable for PWB, MCM-L, direct chip attach (DCA) and fine pitch surface mount (FP-SMT) because of its low in-plane CTE, low Dk, smoothness, dimentional stability, drillability, low cost and conventional processability in conjunction with high Tg epoxy, and that it has other advantages as well. However, cracking of PTH solder interconnects is still identified on p. 9 of the reference as a problem when the aramid material is incorporated into multilayer PWBs, a problem the authors recommend be solved by continuing to introduce high temperature elongation (HTE) class 3 electrodeposited copper foil. In contrast, the inventors of the present invention have solved the problem of interconnect cracking by combining use of the nonwoven aramid material with PTH backfill and proximity positioning of pad and PTH and/or via.

SUMMARY OF THE INVENTION

Accordingly, it is an object of the present invention to provide a PWB having imcreased circuit density and improved electrical and mechanical properties, particularly at those locations at which electrical/mechanical connection is made between the PWB and a surface mounted device.

It is a further object of the invention to permit more efficient use of PWB surface area, to eliminate cracking of solder joints between the PWB and surface mounted device, eliminating the need to reinforce solder joints by means such as encapsulants.

It is another object of the invention to fabricate high density PWBs having filled PTHs and/or vias without also producing spurious resin bleed into the PTHs, but with economical placement of contact pad location at the site of preselected PTHs and/or vias and a TFRL, the overall effect being a reduced inherent mismatch in CTE and reduced cracking in solder joints at any surface mounted device.

Still another object of the invention is to eliminate a layer of packaging and its associated process steps while substantially maintaining the existing PWB manufacturing technology methods.

The foregoing and other objects and advantages are accomplished in the present invention by means of a pad-in-via PWB structure suitable for surface mount which provides greater wiring densities than competing technologies.

DESCRIPTION OF THE PREFERRED EMBODIMENTS

Figure 1:
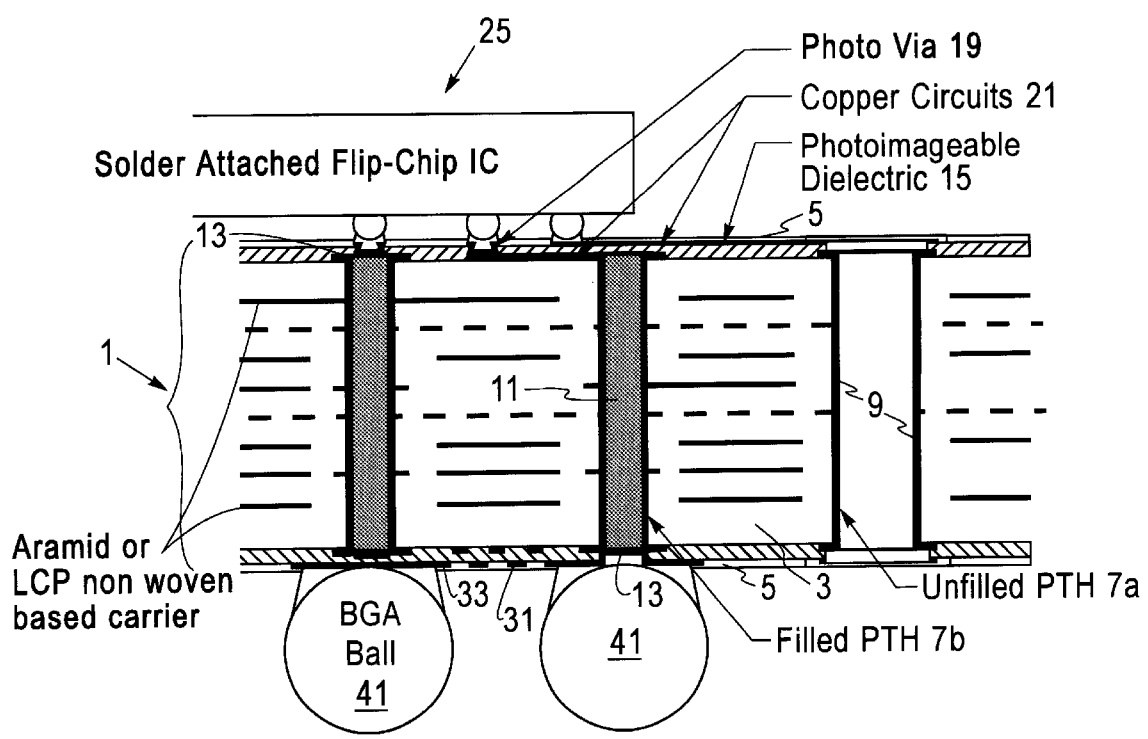
FIG. 1 shows a cross sectional view of a PWB typical of the present invention.

The printed circuit boards of the present invention are useful with fine pitch Ball Grid Array (BGA) integrated circuit chips, flip chip attach integrated circuit chips, MCM-L's, personal computer memory cards, leadless chip carriers, card-on-boards (COBs) assemblies and the like.

The novel printed circuit boards are prepared by first impregnating a non-woven aramid chopped fiber mat or a thermoplastic liquid crystalline polymer (LCP) paper instead of the reinforcement typically used in the electronics industry, which is a woven glass fabric.

The aramid reinforcement is comprised of a random (in-plane) oriented mat of p-aramid (poly(p-phenylene terephthalamide) fibers comprised of KEVLAR, a registered trademark of I.E.DuPont de Nemours, and has a dielectric constant of 4.0 as compared to 6.3 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/° C. below the glass transition temperature when combined with a thermosetting resin, the final composite will possess a CTE which can be controlled and adjusted to match that of silicon or semiconductor chips in the range of about 3 to about 10 ppm/° C. Conventional circuit boards using glass fabric have CTE's in the range of about 16 to about 24 ppm/° C. and are matched for the CTE of Cu (17 ppm/° C.).

The thermoplastic liquid crystal polymer paper is a material called VECRUS, supplied by and a registered trademark of Hoechst Celanese Corp. LCP paper uses the company's registered trademark VECTRA polymer. It has a dielectric constant of 3.25 and a dissipation factor of 0.024 at 60 Hz. The polymer paper has a UL94-V0 rating and an in-plane CTE of less than 10 ppm/° C. The advantages of this material over the aramid mat are the lower dielectric constant and very low moisture absorption, less than 0.02%.

The lower overall CTE allows a semiconductor chip to be attached directly to the circuit board without requiring an underfill encapsulant to stabilize the attachment joints. This feature enables the elimination of an entire level of packaging which is usually achieved using a ceramic chip carrier which is then attached to the printed circuit board. Controlled CTE circuit boards can therefore also be used instead of a ceramic chip carrier with the benefits of being substantially lower in cost, since conventional PWB manufacturing methods and equipment are utilized.

The non-woven aramid or LCP paper, herein also referred to as "low CTE reinforcement" is used in conjunction with a thermosetting resin to form the final composite substrate. Examples of thermosetting resins useful in the invention include epoxy, cyanate ester, bismaleimide, bismaleimide-triazine, nadeimide or combinations thereof. The resin-impregnated low CTE reinforcement is then partially cured to a "B"-stage to form the prepreg, and then the prepreg is cut, stacked, and laminated to form a subcomposite with exterior copper sheets.

The low CTE reinforced circuit board is made from the subcomposite by first patterning holes by drilling through the subcomposite to form the through hole feature to connect top and bottom surfaces. This is followed by plating over the exposed surfaces of the subcomposite and the plated through hole barrels to form plated through holes. Subsequently a desired circuit pattern of surface circuitization is formed using circuitization methods well known in the art. To further increase the wiring density of the circuit board, the circuitized subcomposite is used as a substrate which is to house a film redistribution layer comprised of patterned circuitry embedded in a polymer layer attached to the top surface of the low CTE reinforced circuit board. Through various means of back-filling the plated through holes in the subcomposite, subsequent wiring layers atop the circuit board surface can now exist across the entire surface area including those areas over the top of the plated through holes. In this way we eliminate the restrictions on the surface of the circuit board caused by the presence of the plated through holes. Alternatively, instead of mechanical drilling, through holes can be fabricated by high speed laser ablation since the entire dielectric substrate is comprised of organic materials. For purposes herein, the term "drilling" encompases either method of through hole and via preparation.

In order to facilitate understanding of the present invention, reference is made to the following detailed description taken in conjunction with the above described drawings.

A cross sectional illustration of a typical printed circuit board 1 of the invention is shown in FIG. 1. The printed circuit board 1 shown in FIG. 1 has a subcomposite 3 consisting of a series of low CTE reinforcement composite dielectric layers and a film redistribution layer 5 located on each outer surface of subcomposite 3. Extending through the subcomposite 3 are plated through holes 7a and 7b. Each of the plated through holes 7a and 7b has plated barrels 9. Plated through hole 7a is unfilled, and is for insertion of a pin-in-through-hole connector (not shown). Plated through hole 7b is filled with fill composition 11, and extends through the subcomposite 3 up to the film redistribution layer 5, when present, where it terminates in a conductive copper cap 13. The subcomposite has external circuitization 21, buried beneath the film redistribution layer 5, as well as internal power and signal lines.

The film redistribution layer 5, when present, formed of a photoimagable dielectric 15, in order to form photo vias 19 for interconnection between to the conductive copper cap 13, or other exposed copper surface on the subcomposite 3. The thin film distribution layer contains patterned copper circuitry, 31 either embedded within the distribution layer or on the surface of the distribution layer, including pads 33. Pads 33 are for mounting surface mount devices, e.g., integrated circuit chip 25, with solder balls 41.

Figure 2:
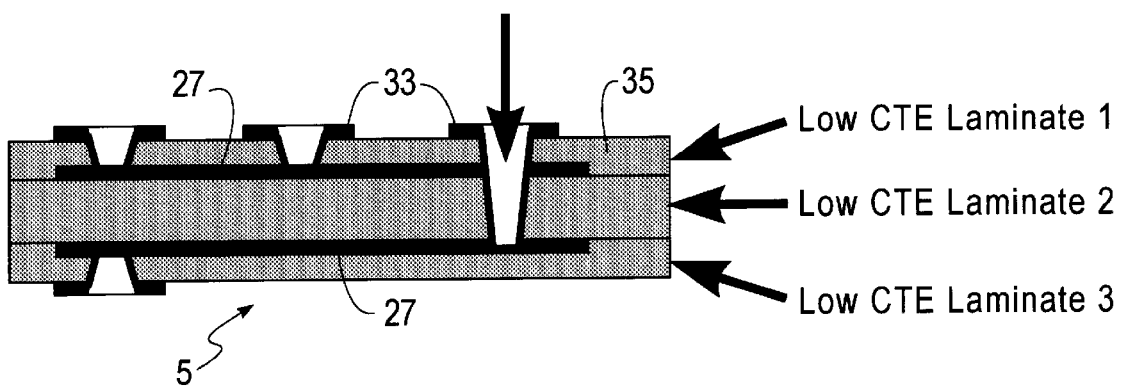
FIG. 2 shows across sectional view of a thin TFRL film redistribution layer and the low CTE laminate layers of which it is comprised, and illustrative blind via interconnections.

Alternatively, FIG. 2 shows a cross sectional view of a film redistribution layer 5, comprised of one or more layers of low CTE reinforcement composite 35, depicted as low CTE laminate layer 1 through 3 in FIG. 2. Laser ablation or patterned plasma etching is used to form the interlayer connections between copper circuit layers 27, or between copper circuit layers 27 and pads 33.

EXAMPLES

The following examples illustrate methods of preparing a printed circuit board having a film redistribution layer on non-woven aramid fiber of controlled expansion substrate and optionally having filled plated through holes. It is understood that the examples are illustrative and that many variations are possible within the scope of the invention.

One example includes preparing a dielectric layer (defined here as prepreg) by solution impregnating THERMOUNT E220, a non-woven aramid reinforcement, with XU-8213 resin, a registered trademark of Ciba. This layer is "B"-staged in a continuous manner in a treater tower to produce prepregs with various resin flow and pick-up. A printed circuit board subcomposite is then laminated utilizing such prepreg and with 0.5 ounce/square foot Cu foil on both sides, and vapor grit blasted to remove epoxy residue left from the laminating process. The laminated Cu foil is then thinned by etching to about 0.00025 inch. Holes for the plated through holes are drilled, and a sheet of redistrbution layer material is drilled with the same plated through hole pattern. Meanwhile, the drilled subcomposite is deburred and chemically hole cleaned to prepare the through hole barrels for plating. The subcomposite is seeded with a palladium/tin colloidal suspension by a known method which makes the exposed surfaces catalytic for electroless Cu plating. Copper is electrolessly plated over the exposed surfaces and in the plated through hole barrels to a thickness of about 0.001 to 0.0012 inch.

Soldering SMCs to the surface pads (lands) of unfilled PTH's is undesirable because the solder used for assembly tends to wick down into the holes resulting in low volume, unreliable solder joints.

One solution to this problem is to fill the PTHs with a solid material, and, if the fill material is not electrically conductive or solderable, to coat the surface of the filled PTH with a conductive, solderable material, by means such as over plating.

Selection criteria for a PTH fill material include chemical compatibility with PWB fabrication processes and materials; sufficient flow to fill small, high aspect ratio PTHs; ability to be transformed into a solid material with a minimal volume change after filling; thermal expansion compatible with the rest of the PWB structure; and good adhesion to the metallization in the barrel of the PTHs.

One class of materials which can be formulated to meet these requirements includes thermosetting resins filled with inorganic powders. Especially useful are epoxy resins, of the same type used to make conventional epoxy/glass prepreg used for PWB construction, filled with metal powders, especially copper.

Selectively filling the plated through holes in the controlled CTE circuit board also allows the fabrication of the redistribution layer atop the circuit board. This could not be achieved by leaving the PTHs unfilled because the dielectric redistribution layer could not be uniformly coated onto the circuit board.

Known methods for mass filling plated through holes of printed circuit boards suffer from bleeding along the surface of the boards and into through holes which are not intended to be filled, leading to soldering defects during assembly. The disclosed process eliminates the problems caused by bleeding during hole fill and provides a process to make pad-in-via surface mount PWBs and film redistribution layer (FRL) technology PWBs with higher routing densities than permitted by competing technologies. For example, trying to fill PTHs by dispensing the fill material from a syringe through a needle into the holes is not cost effective. A method for mass filling of the PTHs is required for economical manufacture. The use of a squeegee to force the fill material into the PTHs might appear to be adaptable to a mass fill technique, but it is difficult to get complete fill of high aspect ratio holes thereby.

The PTH fill method used by this invention employs a standard, vacuum laminating press conventionally used to laminate multilayer PWBs. The fill material is coated as a thin layer on a carrier film or foil, and partially cured to form an easy to handle, tack-free sheet. The composite multilayer PWB, with copper foil laminated to the external surfaces is drilled with the pattern of PTHs to be filled.

The drilled holes are activated and plated with metal using any of the many known processes for making PTHs in PWBs. A masking sheet of metal foil or polymer film is also drilled, with the same pattern as the PWB. The masking sheet is placed over the PWB with the holes aligned to those in the PWB. A sheet of the foil or polymer film coated with the fill material is placed over the PWB and masking sheet, with the coated side facing the PWB. An alternative useful for higher aspect ratio PTHs uses a mask and coated sheet on each side of the PWB. One or more of the PWB/mask/coated sheet assemblies is placed in the opening of a vacuum laminating press. The press cycle is activated, which results in the air being removed from the stack, in particular from within the PTHs to be filled, and pressure and heat being applied. The heat causes the viscosity of the partially cured fill material to decrease to the point where it will reflow under the force of the applied pressure into the PTHs. Heating is continued until the time and temperature cycle required to fully cure the fill material has been completed. The press is allowed to cool and the PWB(s) with the filled PTHs are removed. The masking and carrier sheets are carefully peeled away from the PWB, and the PTH fill is now complete.

The PWB with filled PTHs is not yet ready for circuitization, however. The fill process leaves raised nubs of fill material at each of the PTHs, and some of the fill material bleeds to some extent between the mask sheet and the PWB. The nubs and surface film (from bleed) of the cured fill material must be removed before the PWB can be successfully circuitized. This is accomplished by surface abrasion, optionally in conjunction with known PWB chemical hole clean processes, which "etch" cured epoxies.

Since it is desirable to be able to make an electrical connection or solder joint on top of a filled PTH, and the cured fill material may not have the necessary electrical conductivity or solderability, the panel can be overplated with a thin layer of metal (e.g. copper) by the same processes used to activate and plate the PTHs barrels.

The PWB panel can now be circuitized with standard print and etch processing as is known in the industry, and subsequent processing completed conventionally.

A problem arises, however, if it is desired to have both filled and unfilled PTHs on the same PWB. It would seem possible to fill only selected PTH's by drilling holes in the mask sheet only in positions corresponding to the PTHs intended to be filled, leaving the PTHs to be unfilled blocked during the fill operation. The problem is that the fill material, which may bleed under the mask, can also bleed into the PTHs which were to remain clear. This would not be a concern if component leads or pins did not have to be inserted into the PTHs, but the only reason for requiring PTH's to be unfilled is to allow such insertion, and soldering of the pins/leads is also usually required. The fill material which bleeds into pin-in-hole (PIH) PTHs will interfere with solder wetting in the barrel of the PTH, and could possibly constrict the diameter of the hole sufficiently to prevent the lead insertion.

Clearly, when there is a need for selective PTH filling, a process must be found whereby the cleanliness, hence solderability, of the unfilled plated PTH barrels is not compromised.

The method of the invention is to drill and plate only the PTHs to be filled before pursuing the hole fill process described above. The unfilled PTHs are drilled after filling, either before or after the removal of any nubs and bleed. The processes used for overplating the ends of the filled PTHs will also plate the barrels of the newly drilled, unfilled holes. The panel can now be circuitized with conventional print and etch processes.

The invention as described thus far will provide PWBs with selectively filled PTHs. SMC terminals can readily be soldered directly on top of the filled PTHs. However, it is difficult to etch the fine line circuitry needed to support the higher I/O density permitted by placing solder joints directly over filled PTHs. The reasons for this difficulty are that fine line and space etching requires that the metal layer to be etched be as thin as practical. In general, the thinner the metal, the finer the circuitry that can be etched. PTH reliability and survival through assembly (solder) rework processes requires a minimum thickness of metal, usually on the order of 0.001 inch, be plated in the barrels of the PTHs. The process described above results in double plating on the surface of the panel, resulting in a thickness of metal to be etched which is twice the plating thickness plus the thickness of the original foil on the surface.

The invention becomes most useful when combined with the use of a Thin Film Redistribution Layer (TFRL). Such a TFRL adds an additional dielectric and circuitry layer on one or both sides of a PWB with filled and/or unfilled PTHs. The TFRL dielectric is processed using conventional photolithographic techniques (either direct photo-imaging or added photo resist plus etching) to make small blind vias. Metal is plated and patterned on the surface of the TFRL dielectric, using known electroless and/or electroplating and circuit patterning processes, to simultaneously make the circuitry on top of the TFRL dielectric and connections through the blind vias (photo vias) to the underlying circuitry. It is the small size and precision location of the photo vias that gives TFRL its high density wiring capability, which is especially useful for fanning out very fine pitch SMCs.

The use of filled PTHs with TFRL allows the circuitry on top of the circuit board dielectric to be run over the top of the filled PTHs in the underlying card. This makes additional area available for wiring, thus increasing wiring density over that achieved with TFRL without filled PTHs. The ability to have unfilled PTH's allows the use of PIH components, such as connectors.

By manipulating the process sequences required for selective PTH filling and TFRL layering it is possible to achieve fine line (dense) circuitry on the base PWB (subcomposite) and have selective hole filling on the same TFRL PWB. The basic process flow is as follows:

Example 1

Laminate the PWB with foil on the external surfaces, using well known methods. The foil on the surface of the PWB subcomposite may optionally be thinned at this time to facilitate later etching of fine line circuitry.

Drill the holes for the PTHs to be filled, and also drill masking sheet(s) with the same hole pattern.

Clean holes for plating.

Activate and plate the holes (and surfaces of the PWB) using any of the known processes, plating the barrels of the PTHs to their required thickness.

Place a masking sheet, optionally polyimide, over the PWB, and align the holes in the sheet with those in the PWB.

Place a sheet of foil, optionally copper, coated with the partially cured fill material, optionally epoxy, over the masking sheet with the coating facing the PWB. Optionally, a second masking sheet and coated foil may be placed similarly on the opposite side of the PWB to facilitate the filling of high aspect ratio holes.

Place one or more of the prepared stacks of PWB, mask and coated foil into the opening of a vacuum laminating press.

Activate the press cycle to remove air from the PTHs, and apply heat and pressure to first force the fill material to reflow through the holes in the mask and into the PTHs in the PWB, and then to fully cure the fill material.

Remove the PWB(s) with filled PTHs from the press and peel off the masking sheets and carrier foils.

Abrasive and/or chemical nub and bleed removal may optionally be done at this point.

Drill the holes for the unfilled PTHs.

Clean the holes using abrasive and/or chemical means to allow plating of the unfilled holes. This step may also serve as the nub and bleed removal step if it was not done previously.

Activate and plate the holes (and surfaces of the PWB) using any of the known processes for PTHs, but plate only a thin layer (about 0.0001 to about 0.0005 inch), instead of the full thickness required in the PTH barrels in order to facilitate the fine line circuit etching to follow.

Circuitize the PWB subcomposite using known print and etch methods.

Apply the TFRL dielectric material to one or both sides of the circuitized subcomposite.

Photo process the dielectric to make holes (photo vias) where connections are desired between the existing subcomposite circuitry and that to be formed on the top of the dielectric layer(s). Photo vias must be formed concentric to, and larger than, all unfilled PTH's. Photo vias may also be formed over filled PTHs where advantageous for circuit design.

Treat the surface of the TFRL dielectric to improve the adhesion of the circuitry to be formed on it, if required.

Activate and circuitize the surface of the TFRL dielectric. Circuitization can be accomplished by full panel plating and subtractive etching, making the surface conductive, and pattern electroplating or pattern electroless plating. In all cases the barrels of the unfilled PTHs, which had only a thin layer of metal plated on them previously, are again plated so that the combined thickness achieved in the two plating steps is equal to or greater than the minimum required thickness for PTHs in a finished PWB.

The PWB can then be finished as desired using known processes.

Example 2

Copper foil (1 oz/ft.) is coated with a composition containing about 20% to about 30% by weight of epoxy resin and about 70% to about 80% by weight of copper powder, using known film coating methods. Methyl ethyl ketone is used as a solvent in sufficient quantity to achieve a mix viscosity suitable for the coating method chosen. The epoxy resin is of the phenol cured cresol-novolac type and is catalyzed using a tertiary amine. The copper powder has a particle size distribution of about six micrometers and smaller in diameter.

The coating is then heated to remove the majority of the solvent and produce a tack-free surface. The thickness of the coating thus dried is in the range of about 0.002 to about 0.006 inches.

Using known methods, the PWB subcomposite is laminated with copper foil (½ oz/ft.) on both sides.

The surfaces of the subcomposite are then vapor (grit) blasted to remove epoxy residues from the lamination process.

The external copper foil is thinned by etching to a thickness of about 0.00025 inch.

The holes for the PTHs to be filled are drilled.

A sheet of polyimide foil is drilled with the same hole pattern.

The subcomposite is then processed through a mechanical deburring operation and then a chemical hole cleaning operation to prepare the PTH barrels for plating.

The subcomposite is seeded with a palladium/tin colloidal suspension to make the barrels of the PTHs catalytic for electroless copper plating.

The subcomposite is then electrolessly copper plated to a thickness of about 0.001 to about 0.0012 inches. Plating occurs in the hole barrel and over the surface of the external copper foil.

The drilled polyimide foil is placed over the plated subcomposite, and the holes aligned. A sheet of the coated foil, prepared above, is placed on top of the polyimide foil.

The subcomposite and two foils are placed in a vacuum laminating press, vacuum pulled, and heat and pressure applied. The heat and pressure first cause the coating on the foil to soften and flow through the holes in the polyimide foil into the PTH's in the subcomposite. Further heating causes the epoxy of the fill material to cure into a rigid matrix. When the cure is complete the press is cooled, pressure released, and the subcomposite removed from the press.

The copper and polyimide foils are then carefully peeled away from the subcomposite, which now has filled PTHs.

The surface of the subcomposite is mechanically abraded to remove the nubs of fill material from the tops of the PTHs and any fill material residues on the surface of the copper due to bleed between the polyimide mask and the subcomposite.

The subcomposite is drilled with the pattern of holes for the PTHs which are to remain unfilled.

The subcomposite is then processed through a mechanical deburring operation and then a chemical hole cleaning operation to prepare the PTH barrels for plating.

The subcomposite is again seeded with the palladium/tin colloidal suspension, and electrolessly copper plated with an additional about 0.0002 to about 0.0003 inches of copper. The thickness of copper in the unfilled PTHs is about 0.0002 to about 0.0003 inches at this stage of processing.

The subcomposite is pumice scrubbed, a photoresist is applied, exposed and developed in the pattern of the circuitry desired.

The surface copper etched in cupric chloride to form the actual circuit patterns. The thickness of the copper etched is about 0.0014 to about 0.0018 inches, a thickness which facilitates the etching of fine lines and spaces.

The photoresist is chemically removed.

The circuitized subcomposite is processed through a chloriting bath to enhance adhesion of the TFRL dielectric.

A dry film, photoimagable polymer is then vacuum laminated on both sides of the subcomposite. This film is about 0.0025 to about 0.003 inches thick.

The photopolymer is then exposed with the pattern of the desired vias between the subcomposite circuitry and the circuitry to be formed on top of the photopolymer.

The via openings are developed in the photopolymer.

The photopolymer is exposed again and baked to achieve a fully cured state.

The surface of the cured photopolymer dielectric is then vapor blasted and subjected to a chemical hole clean process to enhance the adhesion of the copper to be deposited next.

The composite is again seeded with colloidal palladium/tin.

A dry film photoresist that is impervious to the action of electroless copper plating baths is vacuum laminated over the seeded dielectric.

The photoresist is exposed with the image of the circuitry to be formed and the image developed.

The seeded composite with the imaged photo resist is placed in an electroless copper plating bath for a time sufficient to plate to a thickness of about 0.0007 to about 0.0010 inches. Plating occurs in the unfilled PTHs as well, resulting in a final barrel thickness of about 0.0010 to about 0.0013 inches.

The photoresist is then chemically stripped, and the composite circuitization is complete.

The PWB composite may now be additionally processed to provide gold or tin/lead plated features, solder masks, and the like.

It is understood that the invention may be embodied in modifications of the present invention forms without departing from the spirit or central characteristics thereof. The aforementioned examples and embodiments are therefore to be considered in all respects as illustrative rather than restrictive, and the invention is not to be limited to the details given herein.

What is claimed is:

1. A high,density PWB having increased circuit density and improved electrical and mechanical properties at locations in which electrical/mechanical connection is made between said PWB and a surface mounted device comprising:

a substrate comprising a thermoset resin selected from the group consisting of epoxy, bismaleimide, and cyanate resins, and combinations thereof, impregnated with an organic reinforcement material selected from the group consisting of a random oriented mat of chopped p-aramid fibers which are transversely isotropic and have an axial CTE of about −3 to about −6 ppm/° C. below the glass transition temperature and a thermoplastic liquid crystalline polymer paper.

said impregnated substrate having a first major surface and a second major surface;

a plurality of electrically conductive through-holes extending between and electrically interconnecting said first and second surfaces;

and at least one of said first and second surfaces including a thin film redistribution layer affixed thereto;

said organic reinforcement material having a dielectric of at least 3.25, and possessing in combination with said thermoset resin, a low overall CTE which is adjusted to match the CTE of a solder mounted silicon semiconductor chip in the range of about 3 to 10 ppm/° C.

2. The PWB of claim 1, in which said reinforcement material comprises a thermoplastic liquid crystalline polymer paper.

3. The PWB of claim 1, in which said thermoset resin is selected from the group consisting of epoxy, bismaleimide and cyanate resins and combinations thereof.

4. The PWB of claim 1 in which said PWB comprises a sub-composite of a PWB comprising multiple stacks of laminated sub-composites.

5. The PWB of claim 1, in which said reinforcement material comprises a mat.

6. The PWB of claim 5, in which said mat comprises a non-woven aramid chopped fiber mat.

7. The PWB of claim 5, in which said non-woven aramid chopped fiber mat comprises a random in-plane oriented mat of p-aramid (poly(p-phenylene terephthalamide) fibers.

8. The PWB of claim 1, including also at least one surface mounted electronic device.

9. The PWB of claim 8 in which said at least one suface mounted electronic device is mounted directly at the locations at which a preselected number of said through holes extend to at least one of said major surfaces.

10. The PWB of claim 9 in which said through holes comprise a filler.

11. The PWB of claim 10 in which said filler material comprises a thermosetting resin filled with inorganic powder.

12. The PWB of claim 11 in which said inorganic powder comprises copper powder.

* * * * *